US006818936B2

United States Patent
Lin et al.

(10) Patent No.: US 6,818,936 B2
(45) Date of Patent: Nov. 16, 2004

(54) SCALED EEPROM CELL BY METAL-INSULATOR-METAL (MIM) COUPLING

(75) Inventors: Chrong Jun Lin, Hsin-Tien (TW); Hsin-Ming Chen, Hsin-Ying (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 178 days.

(21) Appl. No.: 10/288,197

(22) Filed: Nov. 5, 2002

(65) Prior Publication Data

US 2004/0084712 A1 May 6, 2004

(51) Int. Cl.[7] .................. H01L 27/108; H01L 29/76; H01L 29/94; H01L 31/119
(52) U.S. Cl. .................. 257/300; 257/296; 257/306; 257/307; 257/308; 257/309; 257/312; 257/313; 257/316; 438/250; 438/393
(58) Field of Search ................. 257/296, 300, 257/306–309, 312–313, 316; 438/250, 393

(56) References Cited

U.S. PATENT DOCUMENTS

| | | | |
|---|---|---|---|
| 4,217,601 A | 8/1980 | DeKeersmaecker et al. .. 357/54 |
| 5,063,425 A | * 11/1991 | Yamauchi et al. | 257/298 |
| 5,136,533 A | * 8/1992 | Harari | 365/149 |
| 5,268,315 A | 12/1993 | Prasad et al. | 437/31 |
| 5,856,688 A | 1/1999 | Lee et al. | 257/295 |
| 6,528,842 B1 | * 3/2003 | Luich et al. | 257/315 |
| 2002/0125520 A1 | * 9/2002 | Liu | 257/300 |

* cited by examiner

Primary Examiner—Amir Zarabian
Assistant Examiner—Ida M. Soward

(57) ABSTRACT

A single-poly EEPROM cell is disclosed with a vertically formed metal-insulator-metal (MIM) coupling capacitor, which serves as a control gate in place of a laterally buried control gate thereby eliminating the problem of junction breakdown, and at the same time reducing the size of the cell substantially. A method of forming the single-poly cell is also disclosed. This is accomplished by forming a floating gate over a substrate with an intervening tunnel oxide and then the MIM capacitor over the floating gate with another intervening dielectric layer between the top metal and the lower metal of the capacitor where the latter metal is connected to the polysilicon floating gate.

19 Claims, 6 Drawing Sheets

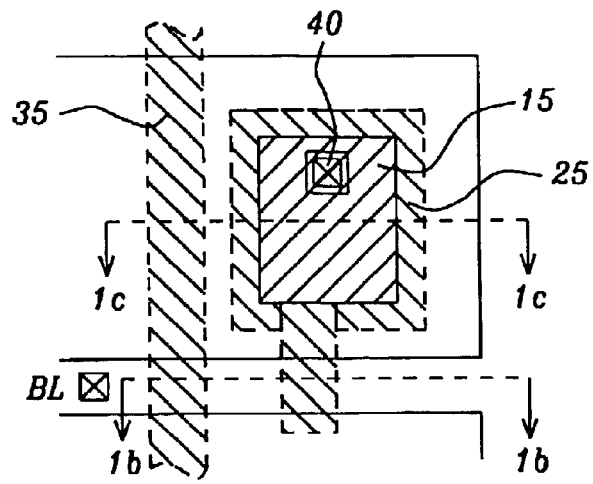
*FIG. 1a – Prior Art*
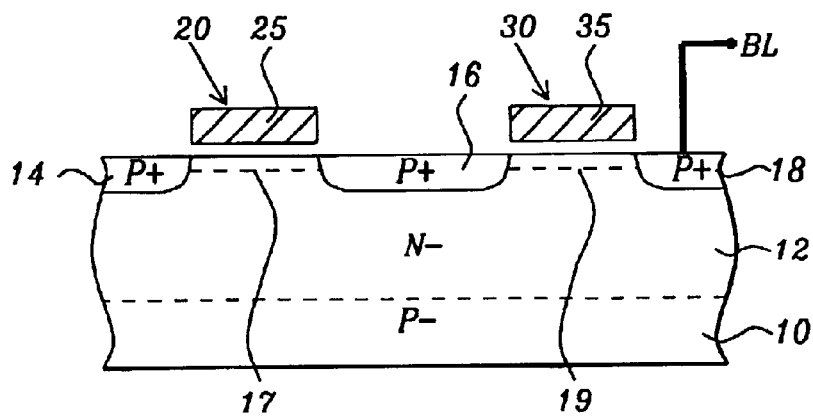
*FIG. 1b – Prior Art*
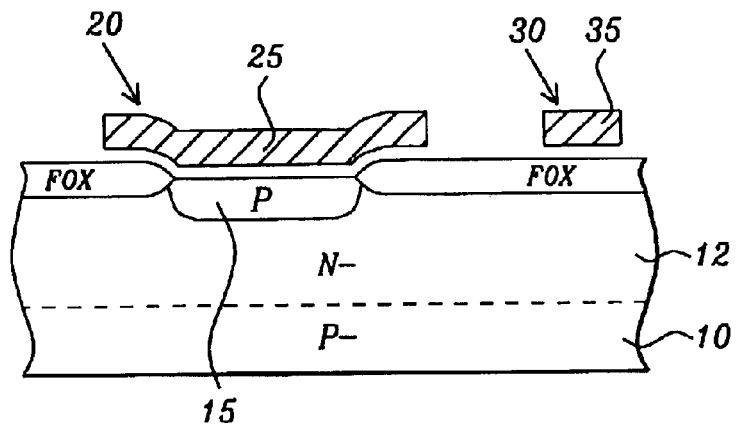
*FIG. 1c – Prior Art*

SCALED EEPROM CELL BY METAL-INSULATOR-METAL (MIM) COUPLING

BACKGROUND OF THE INVENTION (1) Field of the Invention

The present invention relates to semiconductor manufacturing and is more particularly directed to a single-poly EEPROM (electrically erasable programmable read only memory) cell formed with a MIM (Metal-Insulator-Metal) coupling capacitor, and also to a method of forming the same.

(2) Description of the Related Art

It is the preferred practice in the art that, when embedding memory cells into a standard logic process, the single-poly process that is typically used in the fabrication of logic circuitry not be altered. This has led to the development of a single-poly EEPROM cell having N+ source and N+ drain regions formed in a P-substrate and a polysilicon gate overlying a channel region extending between the source and the drain. An N diffusion region formed in the P-substrate serves as the control gate and is capacitevely coupled to the floating gate via a thin oxide layer. The oxide layer has a tunnel window opened in a portion thereof near the N+ drain to facilitate electron tunneling. Since the control gate and floating gate of this single-poly EEPROM cell form a capacitor in a manner similar to that of the more traditional stacked-gate, or double-poly EEPROM cells, the single-poly EEPROM cell is programmed, erased, and read in a manner similar to that of the double-poly EEPROM cell. That is, programming is accomplished by electron tunneling from the floating gate to the substrate, while erasing is realized by electron tunneling from the substrate/drain region to the floating gate. But this N-channel single-poly EEPROM cell requires relative large programming and erasing voltages on the order of 14 volts. These high programming and erase voltages limit the extent to which the size of such cells may be reduced.

Accordingly, workers in the field have devised EEPROM cells which require lower programming voltages. One such cell is a P-channel single-poly flash cell shown in FIG. 1a. The cell is formed in an N-well (12) provided within a P-substrate (10) and includes a P-channel storage transistor (20) and a P-channel select transistor (30), as shown in FIG. 1b. P+ diffusion region (14) serves as the source for storage transistor (20), P+ diffusion region (16) serves as both the drain for storage transistor (20) and the source for select transistor (30), and P+ diffusion region (18), which is coupled to a bit line BL, serves as the drain for select transistor (30). Polysilicon gates (25) and (35) serve as the floating gate and select gate, respectively, of the flash cell as shown in FIG. 1c. Application of a bias voltage to control gate (15) (FIGS. 1a and 1c) enhances channel (17) (FIG. 1b) extending between source (14) and drain (16) of storage transistor (20), and the application of a bias voltage to select gate (35) enhances channel (19) extending between source (16) and drain (18) of select transistor (30).

The P-type buried diffusion layer (15) serves as the control gate of the flash cell of FIG. 1a. A contact (40) is opened in floating gate (25) and in a layer of oxide interposed between floating gate (25) and control gate (15) to enable electrical contact with buried control gate (15). Tunnel oxide layer (50) (FIG. 1b) may extend over channel (17) and substantial portions of source (14) and drain (16). Floating gate (25) together with control gate (15) form an MOS capacitor in the same manner as that of conventional N-channel EEPROM cells. However, the buried junction of control gate (15) of FIG. 1c normally experiences breakdown due to relatively large voltages. It is disclosed later in the embodiments of the present invention an EEPROM cell which is still of single-poly type, but where the buried control gate is replaced by a vertically formed metal-insulator-metal (MIM) coupling capacitor, thereby eliminating the junction breakdown issue and at the same time reducing the cell area by more than 25%.

MIM capacitors are known in the art. In U.S. Pat. No. 5,258,315, Prasad, et al., describe a MIM capacitor formed by sandwiching silicon nitride between a first layer metal and a capacitor top plate using a heterojunction bipolar transistor (HBT) integrated circuit (IC) process. DeKersmaecker, et al., show in U.S. Pat. No. 4,217,601 a non-volatile memory device fabricated from graded or stepped energy band gap insulator MIM or MIS (metal-insulator-silicon) structures.

On the other hand, Lee of U.S. Pat. No. 5,856,688 describes an integrated circuit memory device having non-volatile single transistor unit cells therein. The memory device includes a gate oxide insulating layer on a surface of a semiconductor substrate containing a bulk region of first conductivity type and spaced source and drain regions of second conductivity type therein extending to the surface. First and second separate control gates are also provided in each unit cell and extend opposite the surface. A ferroelectric insulating layer is provided between the first and second control gates and acts as a nonvolatile data storage medium when it is polarized in a predetermined state. A floating gate is also provided having a C-shape. In this manner, Lee provides an integrated circuit device having a reduced unit cell size.

In the present invention, a memory cell of reduced size is also provided. However, this is accomplished differently by replacing a buried control gate of a single-poly EEPROM device with a vertically formed MIM capacitor, which serves as a control gate over the only polysilicon layer floating gate, thereby also reducing the size of the cell by more than 25%.

SUMMARY OF THE INVENTION

It is therefore an object of the present invention to provide a single-poly EEPROM device having a vertically formed metal-insulator-metal (MIM) coupling capacitor, thus with a substantially reduced cell area.

It is another object of the present invention to provide a single-poly EEPROM cell having a vertically formed MIM capacitor which serves as a control gate in place of a buried control gate, thus eliminating the problem of junction breakdown.

It is yet another object of the present invention to provide a single-poly EEPROM cell with increased coupling ratio of the control gate and reduced erase voltage.

It is still another object of the present invention to provide a method of forming a single-poly EEPROM device with a vertically formed MIM capacitor, which serves as a control gate in place of a buried control gate thereby eliminating the problem of junction breakdown and at the same time reducing the size of the cell by more than 25%.

These objects are accomplished by providing a semiconductor substrate having a shallow trench isolation with active region defined; a tunnel oxide covering said semiconductor substrate; an interlevel dielectric (ILD) layer over said tunnel oxide; a floating gate with a window through said ILD reaching underlying said tunnel oxide; a first metal layer over said ILD reaching underlying said floating gate through a via hole; an intermetal dielectric (IMD) layer over said first metal layer; an opening having inside walls in said IMD layer reaching said first metal layer; a capacitor dielectric layer conformally covering said first metal layer and said inside walls of said opening in said IMD layer; and a second metal layer conformally covering said capacitor dielectric layer in said hole, thus forming said MIM coupling capacitor of said EEPROM cell.

The objects are further accomplished by providing a semiconductor substrate having active and passive regions defined; forming shallow trench isolation (STI) in said substrate; forming tunnel oxide layer over said substrate, including said STI; forming an interlevel dielectric (ILD) layer over said tunnel oxide layer; forming a floating gate within said ILD layer and reaching underlying said tunnel oxide layer; forming an intermetal dielectric (IMD) layer over said substrate, including said floating gate; forming an opening in said IMD layer having inside walls in said IMD layer reaching said first metal layer; forming a conformal dielectric layer covering said first metal layer and said inside walls of said opening in said IMD layer; forming a second metal layer conformally covering said capacitor dielectric layer in said hole, thus forming said MIM coupling capacitor of said EEPROM cell.

BRIEF DESCRIPTION OF THE DRAWINGS

FIG. 1a is a top view of a substrate showing the relative placement of the select gate, floating gate and the control gate of a single-poly EEPROM cell of prior art.

FIG. 1b is a cross-sectional view of the substrate taken at section 1b–1b of FIG. 1a showing the floating gate and select gate of prior art.

FIG. 1c is a cross-sectional view of the substrate taken at section 1c–1c of FIG. 1a showing the buried control gate of prior art.

DESCRIPTION OF THE PREFERRED EMBODIMENTS

Figure 2A:
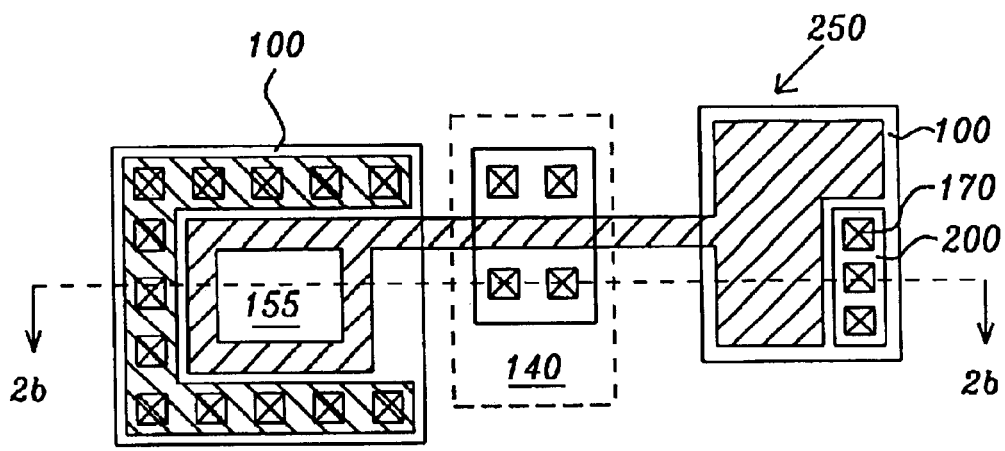
FIG. 2a is a top view of a substrate showing the single-poly layer and the relative placement of the floating gate and the buried control gate of a single-poly EEPROM cell as practiced presently in the manufacturing line.
Figure 2B:
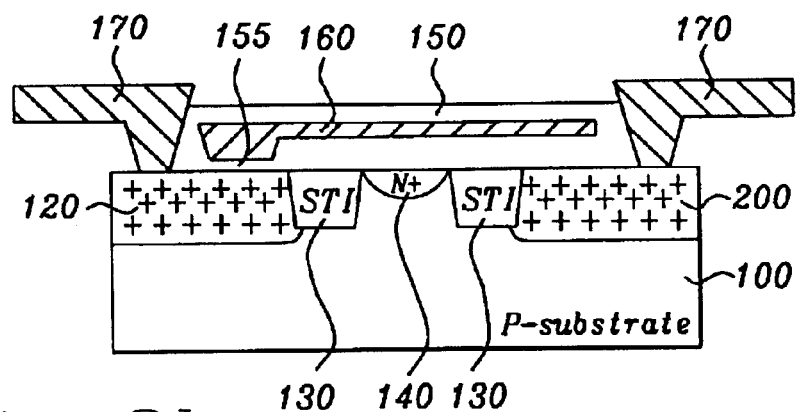
FIG. 2b is a cross-sectional view of the substrate taken at section 2b–2b of FIG. 2a showing the floating gate and buried control gate of the presently practiced art.
Figure 2C:
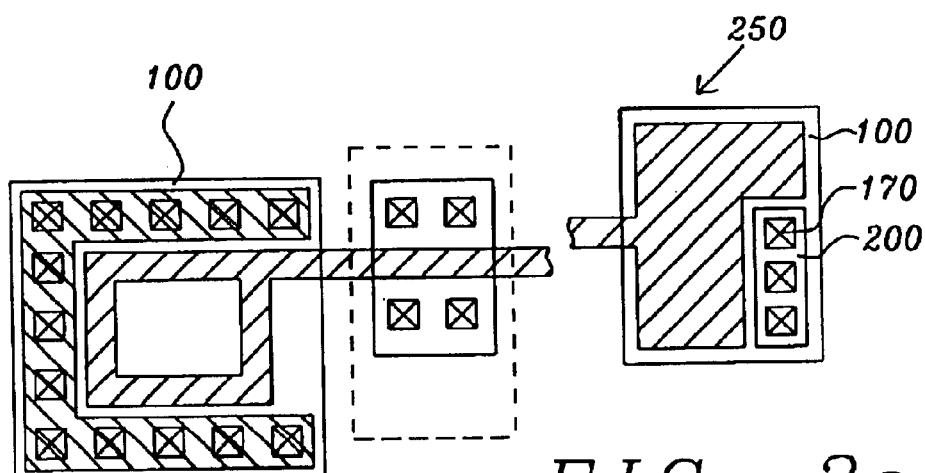
FIG. 2c is another view of FIG. 2a where the proposed removal of the buried control gate is shown schematically, according to the present invention.

Referring now to the drawings, FIGS. 2a–2c show a single-poly EEPROM cell with a buried lateral control gate as practiced in the current manufacturing line. On the other hand, FIGS. 3a–3c disclose how the state of the art single-poly cell of FIGS. 2a–2c can be converted to a device having a vertically formed metal-insulator-metal (MIM) capacitor, which serves as a control gate in place of the buried control gate, thus scaling down the size of the cell by more than 25%. Furthermore, in the absence of the buried control gate, the well-known junction breakdown issue is eliminated, and at the same time, other known benefits such as increased coupling ratio of the control gate as well as low erase voltage are realized. FIGS. 4a–4h describe a method of forming the disclosed MIM capacitor and the cell thereof.

In FIG. 2a, a top view of the substrate in FIG. 2b is shown. FIG. 2b is a cross-sectional view taken at 2b–2b shown in FIG. 2a. Numeral (100) references a partial cross section of a semiconductor substrate, preferably silicon, in an active region defined by conventional methods. Tunneling implant diffused regions (120) separated by shallow trench isolation (130) regions (130) are also formed by conventional techniques. Diffusion region (200) is formed laterally in a portion of the substrate underlying the floating gate (160) shown in FIG. 2b. The floating gate is formed in an interlevel dielectric (ILD) layer (150) such that it extends down to the thin tunnel oxide portion (155) through an opening in the ILD layer as shown in the same Figure. Contacts to the buried tunneling implant diffused regions and to the buried control gate (200) are provided by means of leads (170) as shown in the same FIG. 2b. Thus, erasing of the cell shown in FIG. 2a is accomplished by coupling a sufficient voltage to floating gate (160) via buried control gate (200) while grounding the tunneling implant diffused regions (120) so as to cause the tunneling of electrons from region (120) to the floating gate, while programming is realized by biasing the floating gate through the tunneling implant diffused regions (120) appropriately so as to cause the tunneling of electrons from the floating gate to tunneling implant diffused (120).

It will be apparent from both FIGS. 2a and 2b that because the buried control gate is provided laterally in the substrate, the area of the cell is commensurately enlarged, as referenced by numeral (250) in FIG. 2c. Furthermore, it will be known to those skilled in the art that region (200) serving as the control gate is usually coupled to the floating gate with a relatively high voltage on the order of 14 volts or more. The junction area needs to be large enough to withstand such high voltages, for otherwise, junction breakdown will occur.

It is proposed in the present invention, therefore, a single-poly EEPROM cell with the main feature of a vertically formed MIM capacitor that also serves as the control gate of the cell. This is accomplished by "cutting off" region (250) shown in FIG. 2c, that is, by removing the buried control gate from within the substrate and forming it above the level of the substrate, thus decreasing the area of the cell by more than 25%. The resulting structure is shown in FIG. 3a.

Figure 3A:
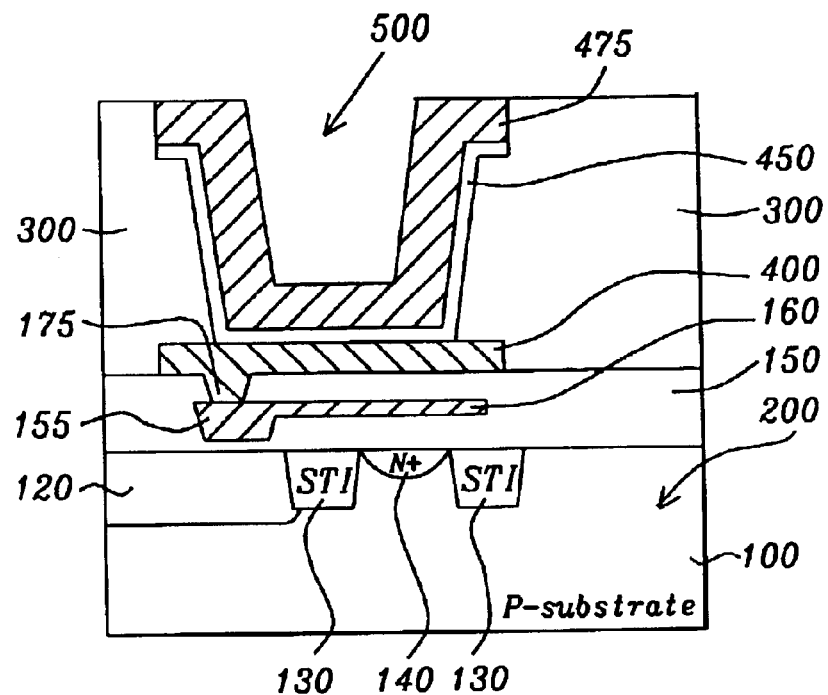
FIG. 3a is a cross-sectional view of a substrate showing the forming of the metal-insulator-metal (MIM) capacitor of this invention.

More specifically, the disclosed cell structure of the present invention in FIG. 3a comprises semiconductor substrate (100), having shallow trench isolation (130) with active region defined; interlevel dielectric (ILD) layer (150) over a substrate, said ILD layer having a tunneling window, or opening (155) reaching the substrate; a tunneling dielectric, or tunnel oxide (125) formed at the bottom of said opening over said substrate; floating gate (160) over said ILD layer, including over said opening and reaching underlying said tunneling dielectric; first metal layer (400) over said ILD layer reaching underlying said floating gate through a via hole (175); intermetal dielectric (IMD) layer (300) over said first metal layer; opening (500) having inside walls in said IMD layer reaching said first metal layer; capacitor dielectric layer (450) conformally covering said first metal layer and said inside walls of said opening in said IMD layer; and second metal layer (475) conformally covering said capacitor dielectric layer in said hole, thus forming said MIM coupling capacitor of said EEPROM cell.

Preferably, the substrate is silicon; the tunnel oxide layer has a thickness between about 70 to 100 Å; the ILD layer has a thickness between about 5000 to 10000 Å; the IMD layer has a thickness between about 4000 to 15000 Å; the floating gate comprises silicon layer having a thickness between about 1500 to 3000 Å; the first metal layer of the MIM capacitor comprises aluminum-copper (AlCu) with a thickness between about 3000 to 7000 Å; the second metal layer of the MIM capacitor comprises AlCu with a thickness between about 3000 to 7000 Å; and the intervening capacitor dielectric layer comprises oxide having a thickness between about 300 to 1000 Å.

Figures 3B, 3C:
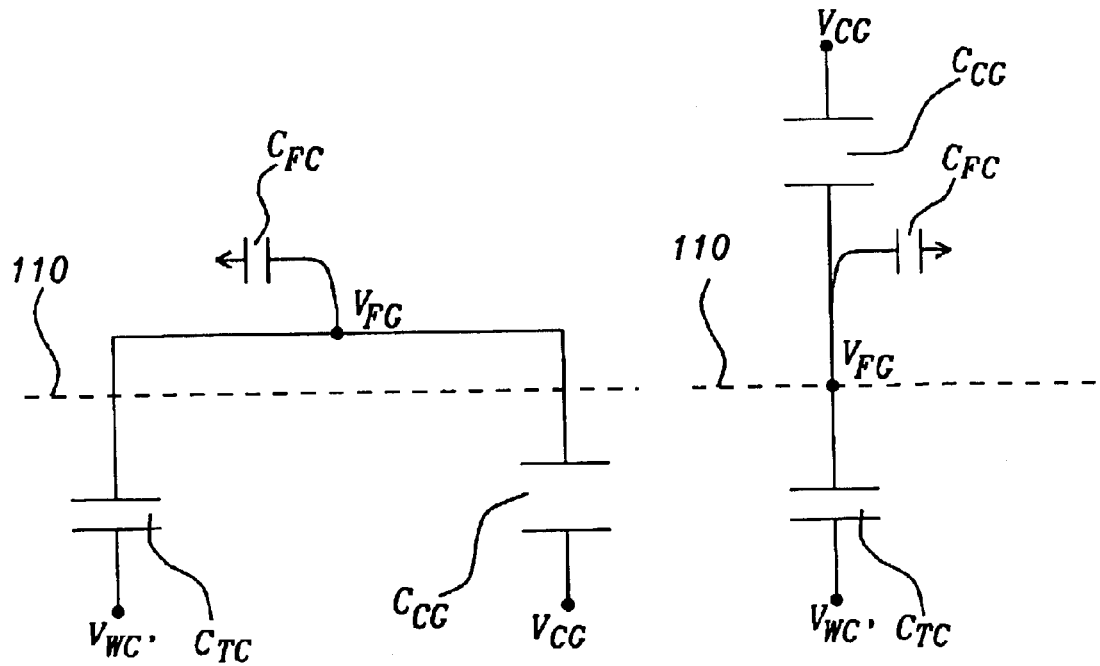
FIG. 3b is a schematic drawing of the various capacitors of the substrate shown in FIG. 2b, according to this invention.
FIG. 3c is a schematic drawing of the various capacitors of the substrate shown in FIG. 3a, according to this invention.

FIGS. 3b and 3c are schematic drawings showing the various capacitors of the single-poly cell of the state of the art and of the present invention, respectively. Phantom line (100) of both Figures represents the surface of the substrate. In the current art of FIG. 3b, the control gate capacitor and the associated capacitance $C_{CG}$ as well as the tunneling capacitor $C_{TC}$ are shown within the substrate below surface (110), which correspond to the physical cross-section of the substrate shown in FIG. 2b. The schematic of FIG. 3c, on the other hand, corresponds to the physical cross-section of the disclosed cell shown in FIG. 3a where the capacitor, namely, the MIM capacitor of the invention, is disposed above substrate level (110). It will be noted that the parasitic, or fringe capacitor, and hence its capacitance $C_{FC}$, resides above the substrate level in both instances.

Figure 4A:
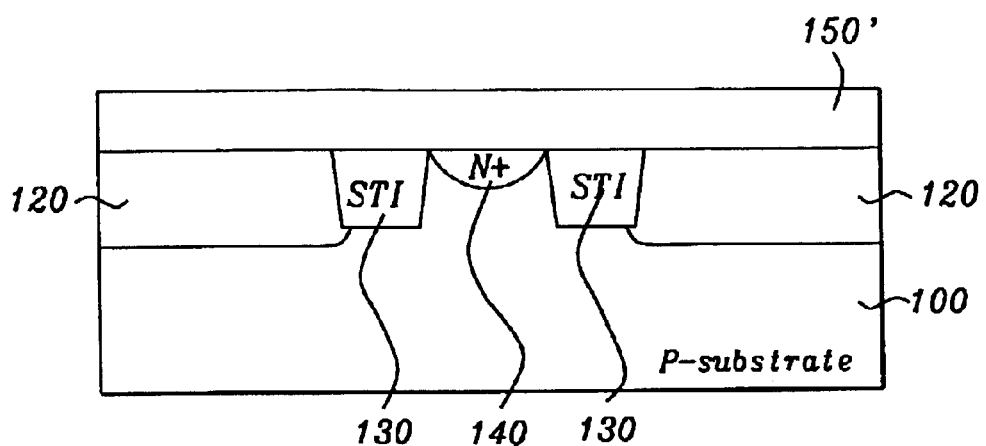
FIG. 4a is a cross-sectional view of a partial substrate showing the forming of tunnel oxide layer, according to this invention.

Now, a method of forming the MIM capacitor of the present invention will be disclosed in FIGS. 4a–4h. In FIG. 4a, substrate (100), preferably of P-type silicon, is provided with source/drain regions (120) defined and separated by shallow trench isolation regions (130), as shown in FIG. 4a. Next, a lower portion of an interlevel dielectric (ILD) layer (150') is formed similar to that of (150) in FIG. 3a.

Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket dielectric layer (150) is preferably formed of a dielectric material chosen from the group of dielectric materials consisting of silicon oxide dielectric materials, silicon nitride, and silicon oxynitride. Preferably, the thickness of the partial dielectric layer (150') shown in FIG. 4b is between about 5000 to 10000 Å.

Figure 4B:
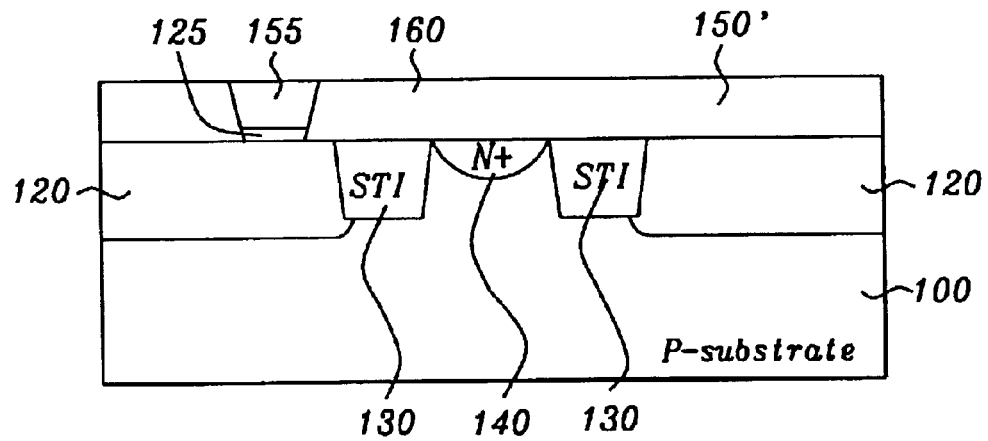
FIG. 4b is a cross-sectional view of a partial substrate of FIG. 4a showing the forming of a portion of an interlevel dielectric (ILD) layer over the substrate, and forming of a first opening in the ILD layer, according to the present invention.
Figure 4C:
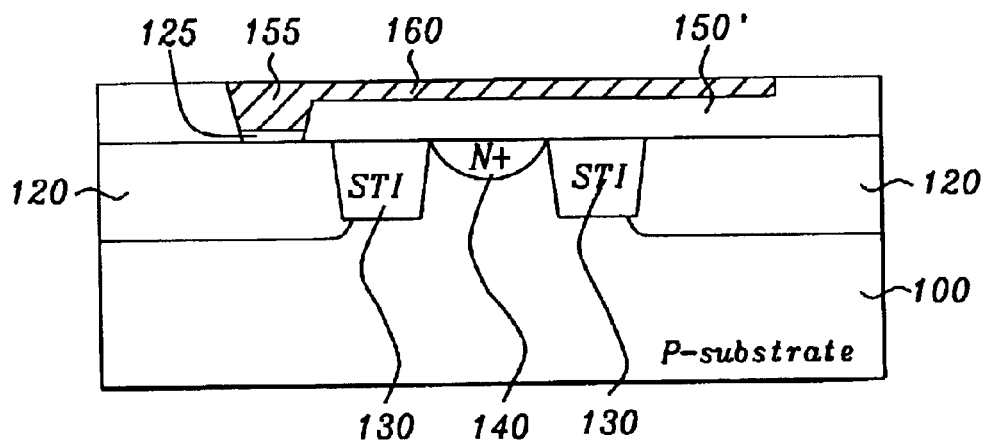
FIG. 4c is a cross-sectional view of a partial substrate of FIG. 4b showing the forming of a polysilicon floating gate, according to the present invention.
Figure 4D:
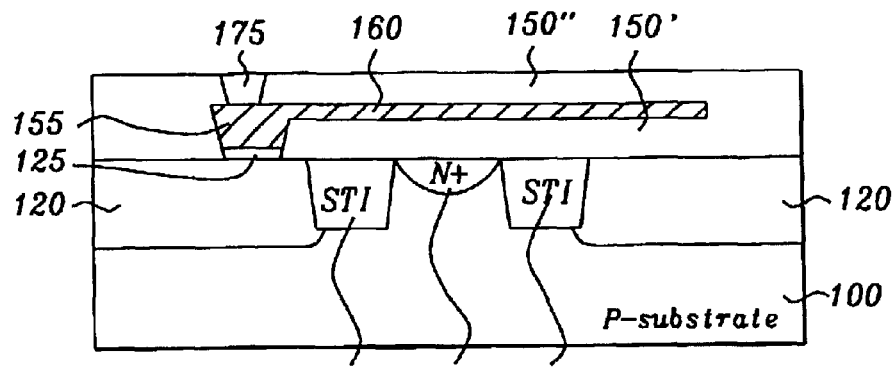
FIG. 4d is a cross-sectional view of a partial substrate of FIG. 4c showing the forming of the upper portion of the ILD layer, and forming of a second opening in the ILD layer, according to the present invention.

Next, partial ILD layer (150') is patterned employing conventional methods to form tunnel oxide window, or opening (155), as shown in FIG. 4b. Opening (155) reaches the underlying substrate, and tunnel oxide (125) is grown on the substrate. Tunnel oxide layer (125) is formed by thermal growth at a temperature between about 700 to 100° C. It is preferred that the thickness of the tunnel oxide is between about 70 to 100 Å. hen, polysilicon layer (160) is formed over the ILD layer and opening (155), through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials. Preferably, an LPCVD method is used employing silane $SiH_4$ as a silicon source material at a temperature range between about 600 to 700° C. The preferred thickness of polysilicon layer (160) is between about 1500 to 3000 Å. Then it is doped to serve as a floating gate through the tunneling window (155) shown in FIG. 4c. Subsequently, an upper portion of ILD layer, (150"), is formed over the polysilicon layer to complete a total thickness between about 5000 to 10000 Å for the total ILD layer, referenced as (150). The desired thickness of ILD layer (150) can be achieved by using any number of conventional dielectric planarization techniques, including but not limited to etch-back, or chemical-mechanical polishing (CMP). Next, opening (175) is formed in the upper portion of ILD layer (150") until polysilicon layer (160) is reached, as shown in FIG. 4d. The opening may be formed by using etchant gases $CHF_3$, $CF_4$ and $O_2$, or preferably, by isotropic wet etch.

Figure 4E:
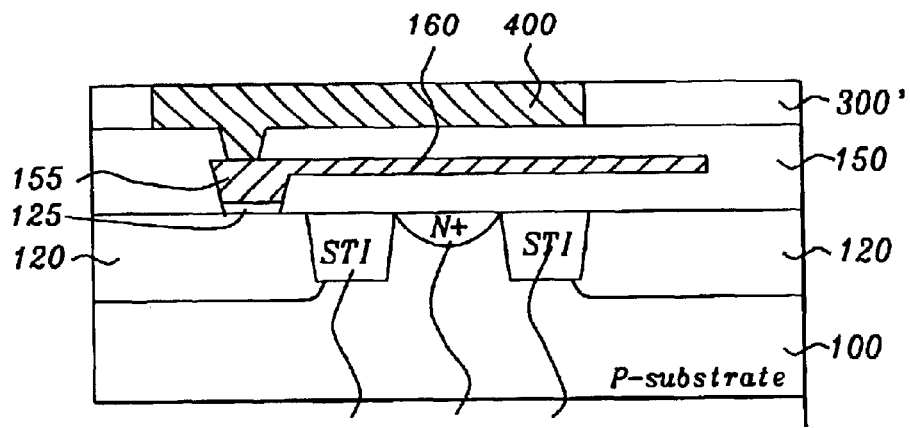
FIG. 4e is a cross-sectional view of a partial substrate of FIG. 4d showing the forming of a first metal layer, according to the present invention.
Figure 4F:
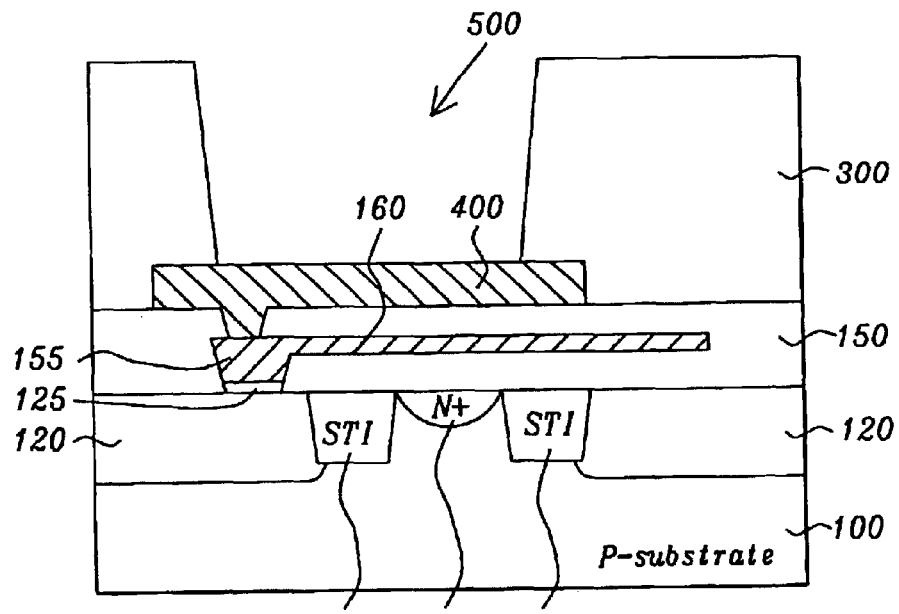
FIG. 4f is a cross-sectional view of a partial substrate showing the forming of an intermetal dielectric (IMD) layer over the first metal layer of FIG. 4e, and the forming of a third opening in the IMD layer, according to the present invention.
Figure 4G:
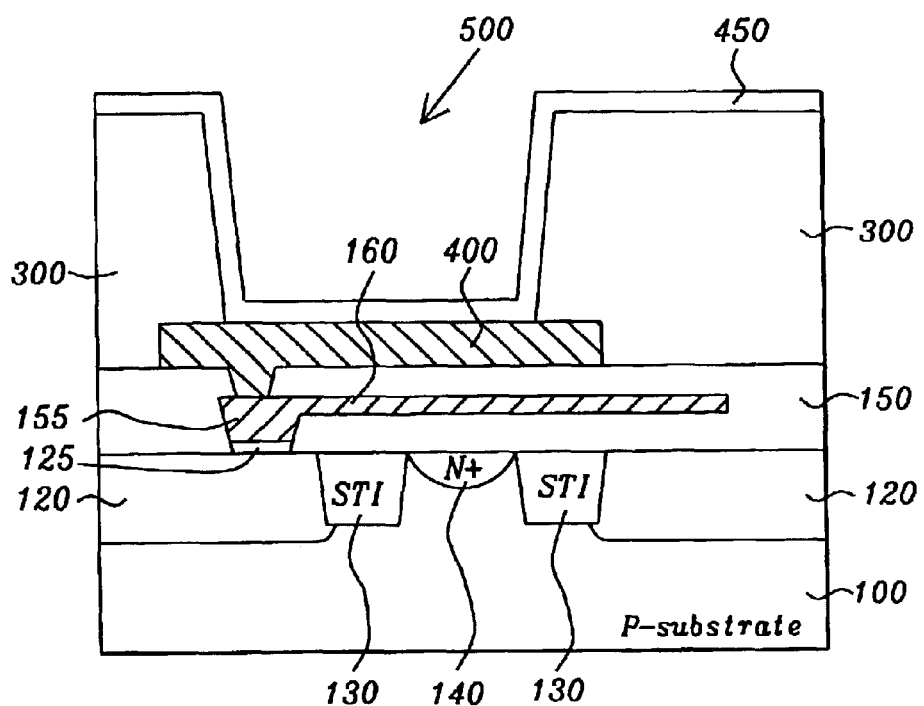
FIG. 4g is a cross-sectional view of a partial substrate showing the forming of a conformal capacitive dielectric layer on the inside walls, including the first metal layer at the bottom of the third opening of FIG. 4f, according to the present invention.

As a main feature and key aspect of the present invention, first metal layer (400) is next formed over ILD layer (150), filling second opening (175) as shown in FIG. 4e. It will be noted that metal (400) contacts polysilicon layer (160). Preferably, the metal comprises AlCu and is deposited using physical vapor deposition (VPD) to a thickness between about 3000 to 5000 Å. Any excess metal is removed by etch-back or chemical mechanical polishing (CMP). Metal (400) will form the bottom plate of the metal-insulator-metal (MIM) capacitor of this invention. The top plate of the capacitor is formed as follows:

An intermetal dielectric (IMD) layer (300) is next formed using any one of the earlier cited LPCVD, CVD or PVD sputtering methods. For the preferred embodiment of the present invention, LPCVD is preferred with a thickness of the IMD layer between about 4000 to 15000 Å. Next, a third opening (500) is formed in the IMD layer, exposing the first metal layer as shown in FIG. 4f. This is followed by forming a conformal layer of a capacitive dielectric layer (450) as shown in FIG. 4g. It is preferred that the dielectric comprises $SiO_2$ and is formed by chemical vapor deposition (CVD) at a temperature between about 100 to 400° C. The preferred thickness of dielectric layer (450) is between about 300 to 1000 Å.

Figure 4H:
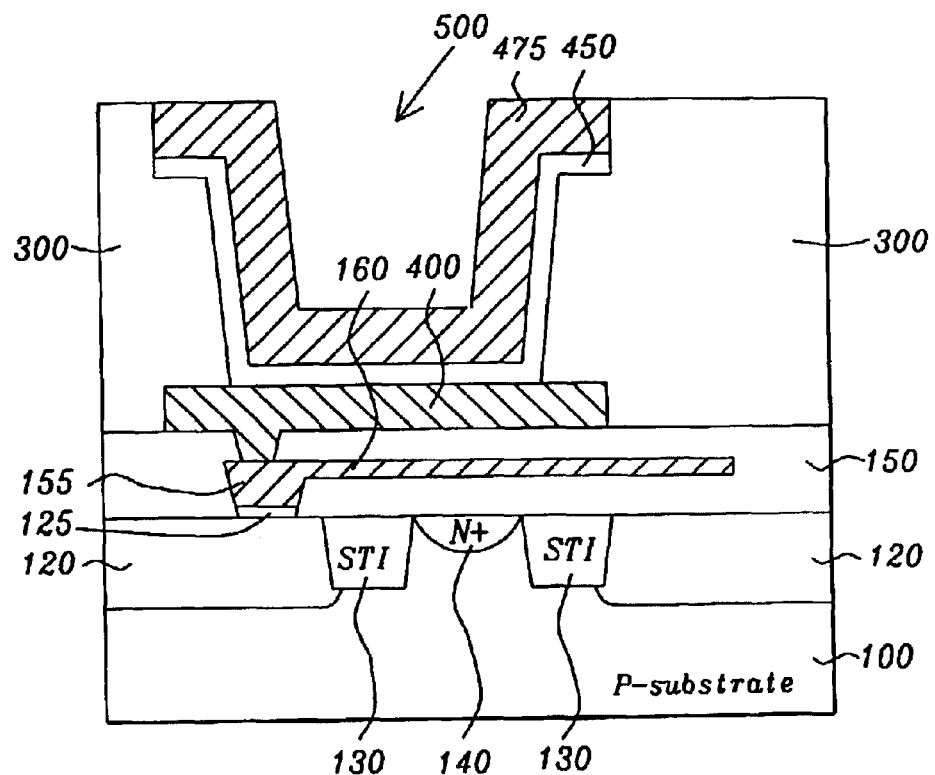
FIG. 4h is a cross-sectional view of a partial substrate showing the forming of a second metal covering the conformal dielectric layer of FIG. 4g, thus forming the MIM capacitor of the present invention.

Finally, as another key aspect of the present invention, the metal-insulator-metal (MIM) capacitor is completed by forming second metal layer (475) shown in FIG. 4h. It is preferred that layer (475) comprises AlCu and is deposited using PVD to a thickness between about 3000 to 7000 Å. any excess metal is removed by employing etch-back or CMP. It will be apparent to those skilled in the art that layer (475) forms the top plate of the MIM capacitor, which in turn forms the insulator for the control gate of the single-poly EEPROM cell of the present invention.

It will be apparent to the workers in the field that the same polysilicon layer used for the floating gate of the embedded memory cell can be used for forming the gate of the logic circuits without altering the single-poly process that is typically used in the fabrication of logic circuitry. Thus, though these numerous details of the disclosed method as set forth here are applicable to memory fabrication, they can also be applicable to other processes. Furthermore, the process parameters are cited here to provide an understanding of the present invention; however, it will be obvious to those skilled in the art that these specific details need not be employed to practice the present invention. At the same time, it will be evident that the same methods may be employed in other similar process steps that are too many to cite, such as forming capacitive dielectric layers of different thicknesses or of different dielectric constants to achieve different insulating characteristics for the disclosed metal-insulator-metal capacitor.

That is to say, while the invention has been particularly shown and described with reference to the preferred embodiments thereof, it will be understood by those skilled in the art that various changes in form and details may be made without departing from the spirit and scope of the invention.

What is claimed is:

1. An EEPROM cell having a Metal-Insulator-Metal (MIM) coupling capacitor as a control gate comprising:
   an interlevel dielectric (ILD) layer over a substrate, said ILD layer having an opening reaching the substrate;
   a tunneling dielectric formed at the bottom of said opening over said substrate;
   a floating gate over said ILD layer, including over said opening and reaching underlying said tunneling dielectric;
   a first metal layer over said ILD reaching underlying said floating gate through a via hole;
   an intermetal dielectric (IMD) layer over said first metal layer;
   an opening having inside walls in said IMD layer reaching said first metal layer;
   a capacitor dielectric layer covering said first metal layer and said inside walls of said opening in said IMD layer; and
   a second metal layer covering said capacitor dielectric layer in said hole, thus forming said MIM coupling capacitor of said EEPROM cell.

2. The MIM coupling capacitor of claim 1, wherein said tunneling dielectric is an oxide thermally grown at a temperature between about 700 to 1100° C. to a thickness between about 70 to 100 Å.

3. The MIM coupling capacitor of claim 1, wherein said tunneling dielectric has a thickness between about 70 to 100 Å.

4. The MIM coupling capacitor of claim 1, wherein said ILD layer has a thickness between about 5000 to 10000 Å.

5. The MIM coupling capacitor of claim 1, wherein said floating gate comprises polysilicon layer having a thickness between about 1500 to 3000 Å.

6. The MIM coupling capacitor of claim 1, wherein said first metal layer comprises AlCu having a thickness between about 3000 to 7000 Å.

7. The MIM coupling capacitor of claim 1, wherein said IMD layer comprises having a thickness between about 4000 to 15000 Å.

8. The MIM coupling capacitor of claim 1, wherein said capacitor dielectric layer comprises $SiO_2$ having a thickness between about 300 to 1000 Å.

9. The MIM coupling capacitor of claim 1, wherein said second metal layer comprises AlCu having a thickness between about 3000 to 7000 Å.

10. A method of forming an EEPROM cell having a Metal-Insulator-Metal (MIM) coupling capacitor as a control gate comprising the steps of:
    forming tunnel oxide layer over a substrate;
    forming an interlevel dielectric (ILD) layer over said substrate and a first opening in said ILD layer reaching said substrate;
    forming a tunneling dielectric in said opening;
    forming a floating gate within said ILD layer and reaching said tunneling dielectric layer through said opening in said ILD layer;
    forming a second opening in said ILD layer over said floating gate;
    forming a lower metal of said MIM capacitor on said ILD layer, and filling said second opening over said floating gate;
    forming an intermetal dielectric (IMD) layer over said first metal over said substrate;
    forming a third opening in said IMD layer having inside walls in said IMD layer reaching said first metal layer;
    forming a conformal dielectric layer covering said first metal layer and said inside walls of said opening in said IMD layer;
    forming a second metal layer conformally covering said capacitor dielectric layer in said hole, thus forming said MIM coupling capacitor of said EEPROM cell.

11. The method of claim 10, wherein said substrate is P-type semiconductor.

12. The method of claim 10, wherein said tunneling dielectric is an oxide thermally grown at a temperature between about 700 to 1100° C.

13. The method of claim 10, wherein said tunneling dielectric has a thickness between about 70 to 100 Å.

14. The method of claim 10, wherein said ILD layer has a thickness between about 5000 to 10000 Å.

15. The method of claim 10, wherein said floating gate comprises first polysilicon layer having a thickness between about 1500 to 3000 Å.

16. The method of claim 10, wherein said first metal layer comprises AlCu having a thickness between about 3000 to 7000 Å.

17. The method of claim 10, wherein said IMD layer comprises having a thickness between about 4000 to 15000 Å.

18. The method of claim 10, wherein said capacitor dielectric layer comprises $SiO_2$ having a thickness between about 300 to 1000 Å.

19. The method of claim 10, wherein said second metal layer comprises AlCu having a thickness between about 3000 to 7000 Å.

* * * * *